(12) United States Patent
Regen et al.

(10) Patent No.: US 7,747,003 B2
(45) Date of Patent: Jun. 29, 2010

(54) WIRELESS HEADSET APPARATUS AND METHODS

(75) Inventors: Paul Regen, Felton, CA (US); Peter Garrett, Aptos, CA (US)

(73) Assignee: Legacy IP LLC, San Jose, CA (US)

( * ) Notice: Subject to any disclaimer, the term of this patent is extended or adjusted under 35 U.S.C. 154(b) by 123 days.

(21) Appl. No.: 12/193,402

(22) Filed: Aug. 18, 2008

(65) Prior Publication Data

US 2008/0298578 A1 Dec. 4, 2008

Related U.S. Application Data

(63) Continuation-in-part of application No. 11/927,079, filed on Oct. 29, 2007, which is a continuation of application No. 11/473,638, filed on Jun. 22, 2006, which is a continuation of application No. 11/009,329, filed on Dec. 9, 2004, now Pat. No. 7,070,425, which is a continuation-in-part of application No. 10/903,412, filed on Jul. 29, 2004, now Pat. No. 6,979,210.

(51) Int. Cl.
*H04M 1/00* (2006.01)
*H04M 9/00* (2006.01)
*H04R 25/00* (2006.01)

(52) U.S. Cl. ............... 379/430; 381/370; 381/376; 455/575.2

(58) Field of Classification Search ........... 379/430; 381/370, 371, 374–378, 381; 455/575.2
See application file for complete search history.

(56) References Cited

U.S. PATENT DOCUMENTS

| | | | |
|---|---|---|---|
| 2006/0140435 A1* | 6/2006 | Sheehy et al. | 381/390 |
| 2007/0003098 A1* | 1/2007 | Martenson et al. | 381/388 |
| 2007/0135186 A1* | 6/2007 | Lee | 455/575.2 |

* cited by examiner

*Primary Examiner*—Tuan D Nguyen
(74) *Attorney, Agent, or Firm*—Donald R. Boys; Central Coast Patent Agency, Inc.

(57) ABSTRACT

A wireless headphone device has a first elongate portion having first and second opposite ends with an attachment interface at the first end, the first portion comprising an on-board power supply and a transceiver with functional circuitry, and a second elongate portion coupled pivotally to the first portion at the second end, and having an ear bud and a microphone at an end away from the pivotal coupling. The functional circuitry enables receiving and playing of audio from an MP3 player through the ear bud, and use as speaker and microphone for a wirelessly coupled telephone.

11 Claims, 15 Drawing Sheets

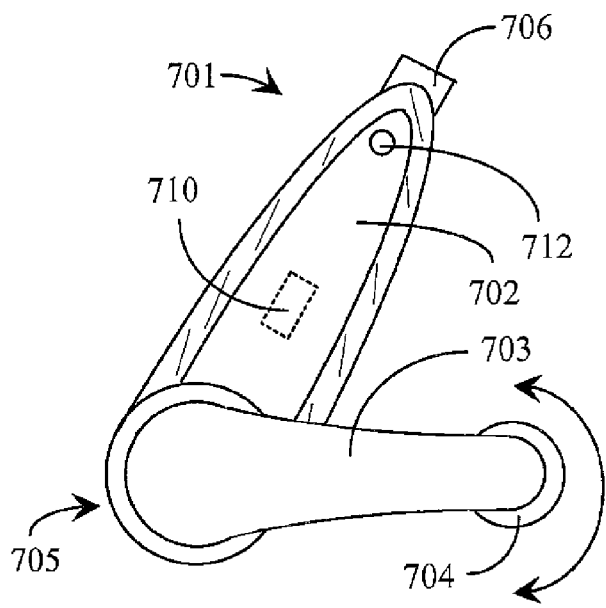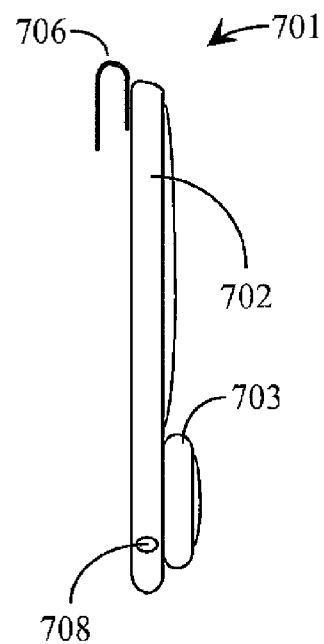
*Fig. 7a*
*Fig. 7b*
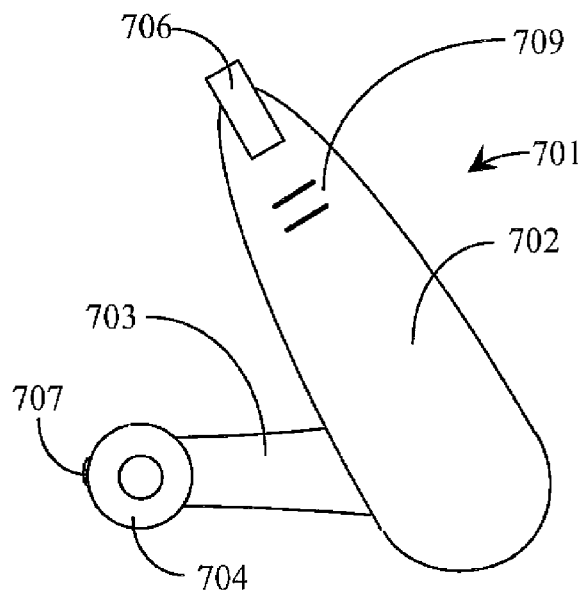
*Fig. 7c*

WIRELESS HEADSET APPARATUS AND METHODS

CROSS-REFERENCE TO RELATED DOCUMENTS

The present application is a continuation-in-part of co-pending application Ser. No. 11/927,079 filed Oct. 29, 2007, which is a continuation of co-pending application Ser. No. 11/473,638, filed Jun. 22, 2006, which is a continuation of Ser. No. 11/009,329, filed on Dec. 9, 2004 and issued as U.S. Pat. No. 7,070,425, which is a continuation-in-part of patent application Ser. No. 10/903,412, filed on Jul. 29, 2004 and issued as U.S. Pat. No. 6,979,210, which claims priority to provisional application No. 60/528,645 filed Dec. 10, 2003. The disclosures of the prior applications are incorporated in their entirety by reference, and priority is claimed for the disclosures as of their filing dates.

BACKGROUND OF THE INVENTION

1. Field of the Invention

The present invention is in the field of headsets and charging devices, and pertains more particularly to headsets enabled for wireless transmission and reception.

2. Discussion of the State of the Art

In the computer arts there continues to be motivation for increased density and ease-of-use in mass storage devices. A solid state device known now in the art as a thumb drive was relatively recently introduced advancing the standard for both density and ease-of-use, and such hot-plug drives are made by several manufacturers. A common feature of thumb drives as known in the art is a male USB connector, and functionality to hot-plug and remove, that is, without turning off the computer to which the drive is connected and disconnected. Another common feature is a plastic protective cover for the male USB connector.

Although the advance in the mass storage art with the advent of thumb drives is dramatic, there are still some problems with such a system. For example, the plastic covers for use on the male USB connectors are not very secure, and tend to come loose and be lost. As a remedy, many manufacturers provide two and sometimes three plastic covers with each device sold, often with different colors. Still another problem is that USB ports on computers are not universally easily visible and accessible. Some such ports are on the back of tower cases which are often placed under desks or other furniture, so finding an unused USB female port for connecting the male USB connector of a thumb drive is often not trivial. When a female port is out of sight or in a darkened area, the connection must often be made by feel alone. Still further, when the thumb drive is connected to a computer, the plastic protective cover is removed, and is easily misplaced.

Another problem in the art related to thumb drives that are enabled for wireless communication is that there is a relative dearth of headsets, and flexibility and functionality of headsets.

SUMMARY OF THE INVENTION

In an embodiment of the invention a wireless headphone device is provided comprising a first elongate portion having first and second opposite ends with an attachment interface at the first end, the first end further comprising an on-board power supply and a transceiver with functional circuitry, and a second elongate portion coupled pivotally to the first portion at the second end, and having an ear bud and a microphone at an end away from the pivotal coupling. The functional circuitry enables receiving and playing of audio from an MP3 player through the ear bud, and use as speaker and microphone for a wirelessly coupled telephone.

Also in one embodiment the attachment interface comprises a flexible rubber, synthetic rubber or plastic loop for engaging an arm of a headset frame. In another embodiment the attachment interface comprises a strap for folding over an arm of a headset frame, and fastening back to the first elongate portion. In yet another embodiment the attachment interface comprises a hinged mechanism with a fold-over element for engaging an arm of a headset frame.

In one embodiment the device is configurable as either a left-side or a right-side device, wherein for a left side device the speaker is enabled and the microphone muted with the second elongate portion positioned rotationally to one side of the first elongate portion, and for a right-side device the speaker is enabled and the microphone muted with the second elongate portion positioned rotationally to the opposite side of the first elongate portion. In some embodiments rotating the second elongate portion to a position to extend away from a user's ear causes the circuitry in the first elongate portion to send a signal to answer an incoming telephone call on a telephone device coupled by a Bluetooth™-compatible wireless protocol.

In some embodiments there is a pushbutton on a surface of the first elongate portion enabled for sending a signal when pressed to answer an incoming telephone call on a telephone device coupled by a Bluetooth™-compatible wireless protocol. Also in some embodiments the first elongate portion comprises on one surface an interface for charging the on-board power supply. In some cases the interface for charging is a female connector for engaging a male connector of a charging cable from either a USB port or from a transformer engaged in a wall outlet. In some other embodiments the interface for charging is a pair of electrodes implemented on a surface of the first elongate portion for engaging similar electrodes connector for engaging a male connector of a charging cable from either a USB port or from a transformer engaged in a wall outlet.

In one embodiment the attachment interface comprises an ear hangar loop for engaging over a user's ear to position the device to place the ear bud in the user's ear.

Also in one embodiment a light-emitting device implemented on a surface of the device configured to change color according to charge level of the on-board power supply.

BRIEF DESCRIPTION OF THE DRAWING FIGURES

Figure 3A:
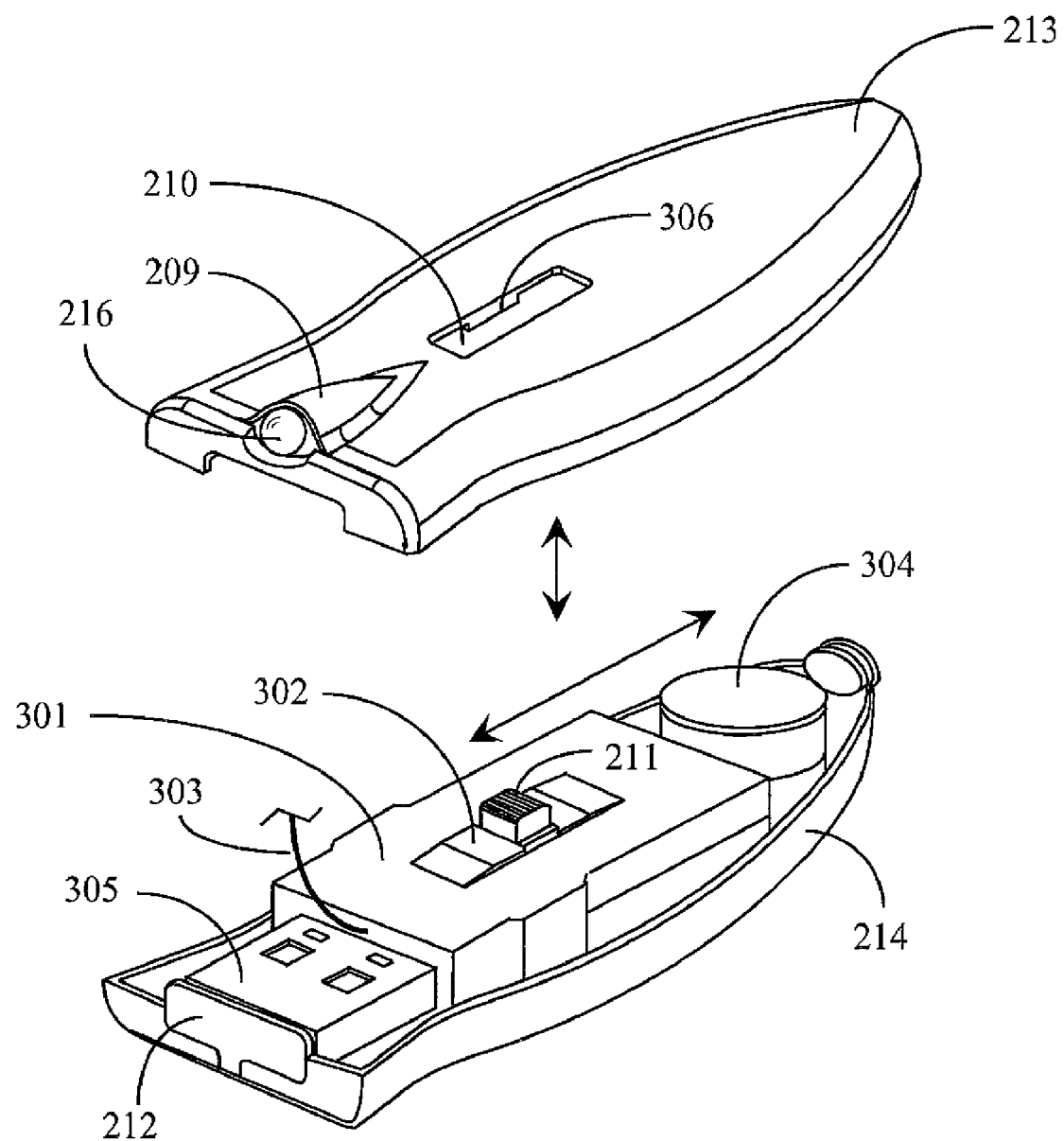
FIG. 3a is an exploded view of the thumb drive of FIG. 2.
Figure 3B:
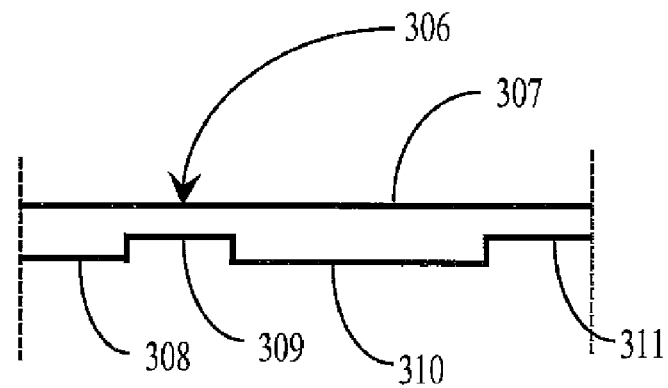

FIGS. 3b, c, and d show details for detenting in an embodiment of the invention.

Figure 4A:
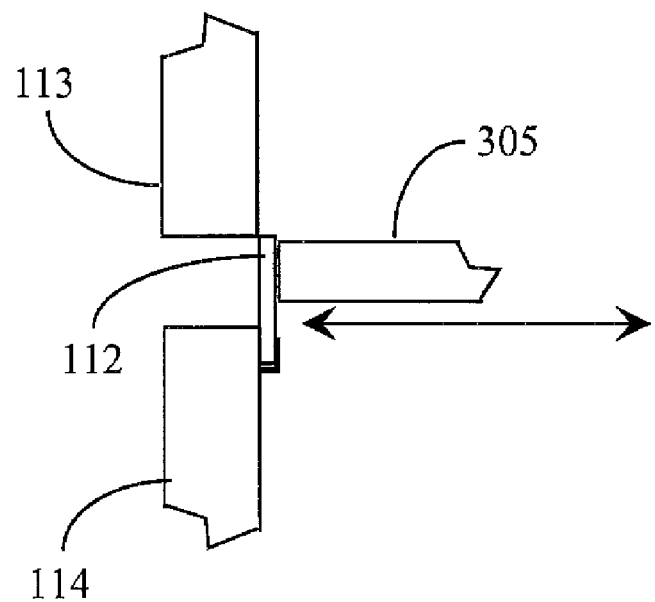
Figure 4B:
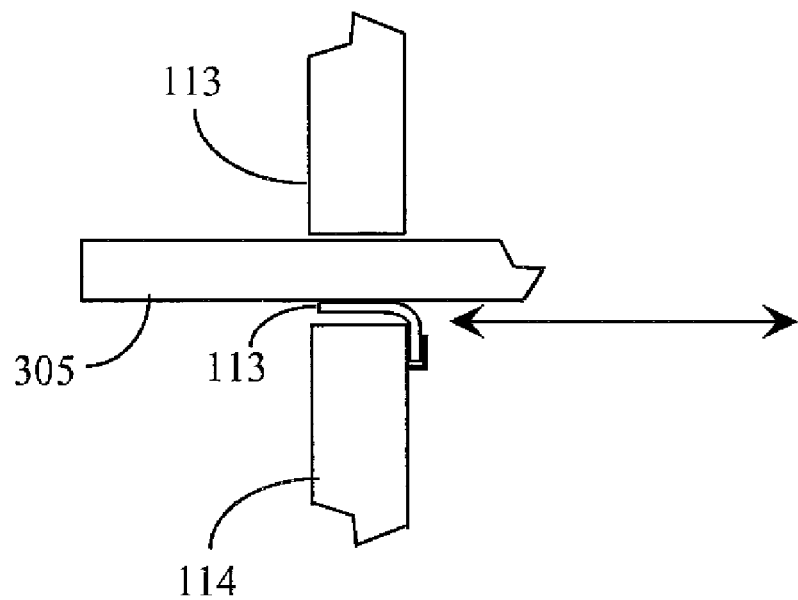

FIGS. 4a and 4b are a diagrams showing one way a protective cover may be implemented.

Figure 5:
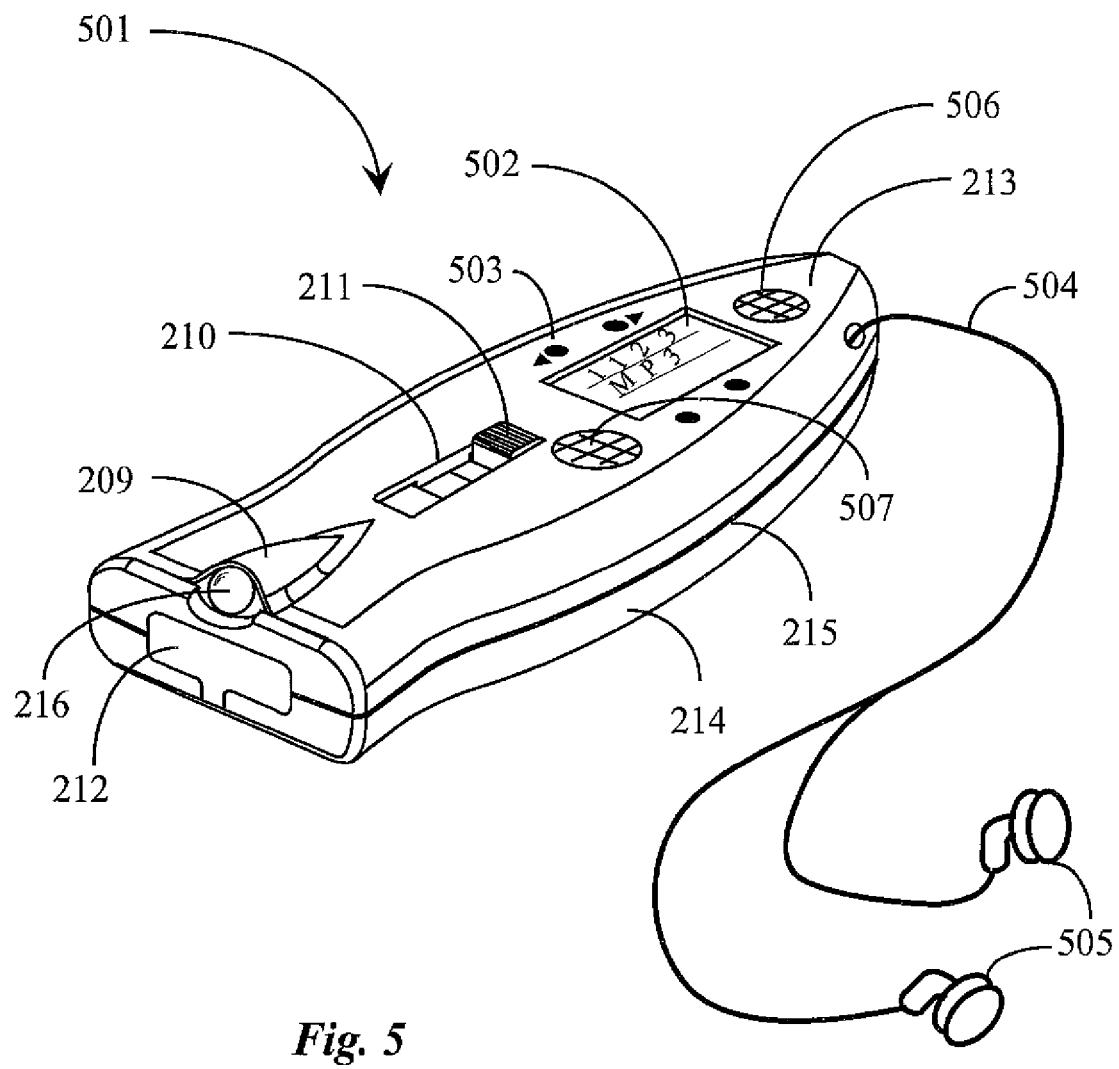

FIG. 5 is a perspective view of a thumb drive according to yet another embodiment of the invention.

Figure 6:
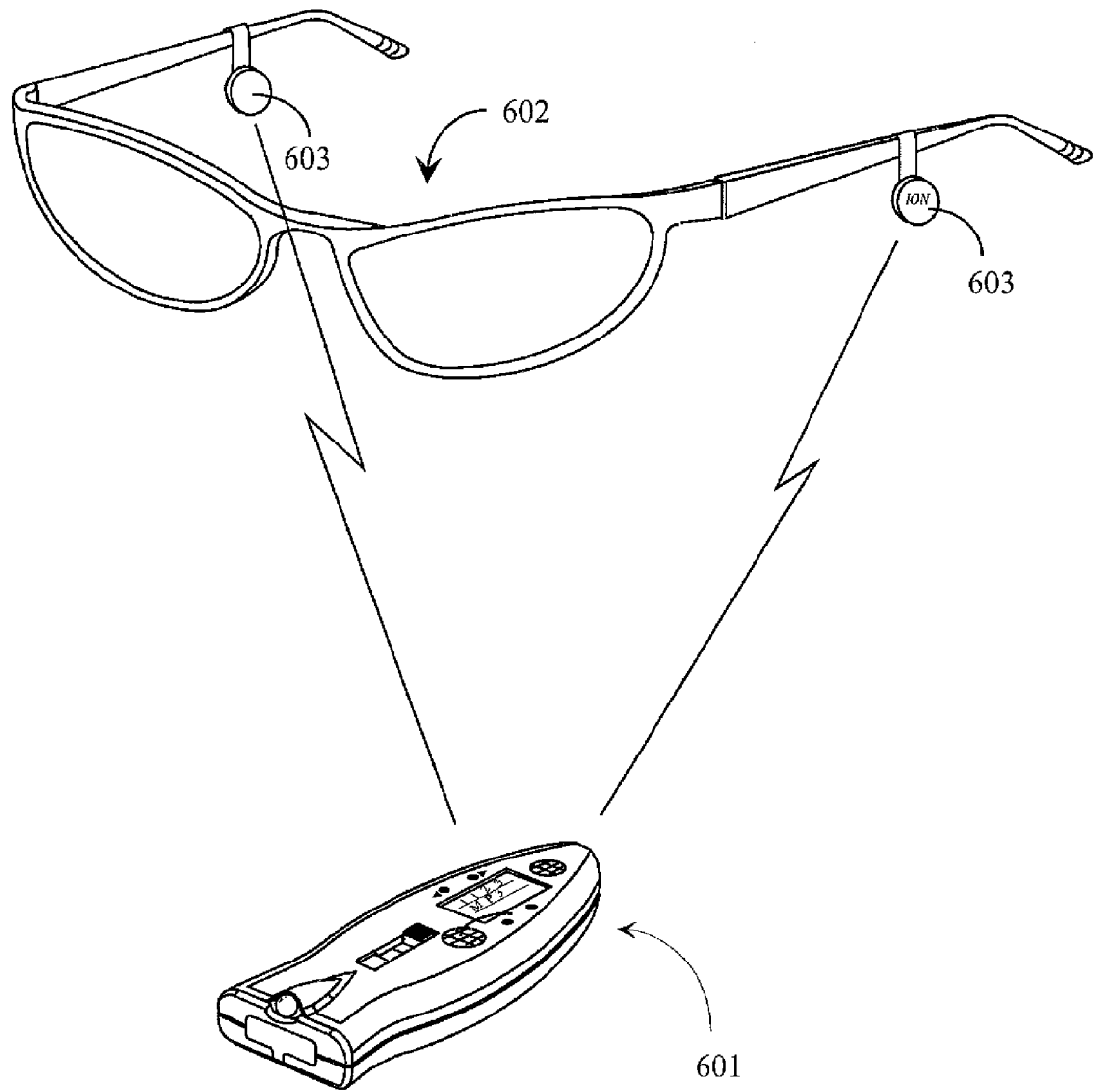

FIG. 6 is a perspective view of a thumb drive associated with a Bluetooth™ headset in yet another embodiment of the invention.

FIG. 7a is a side elevation view of a single speaker/microphone device in an embodiment of the present invention.

FIG. 7b is a front elevation view of the device of FIG. 7a.

FIG. 7c is a back elevation view of the device of FIG. 7a.

Figure 8A:
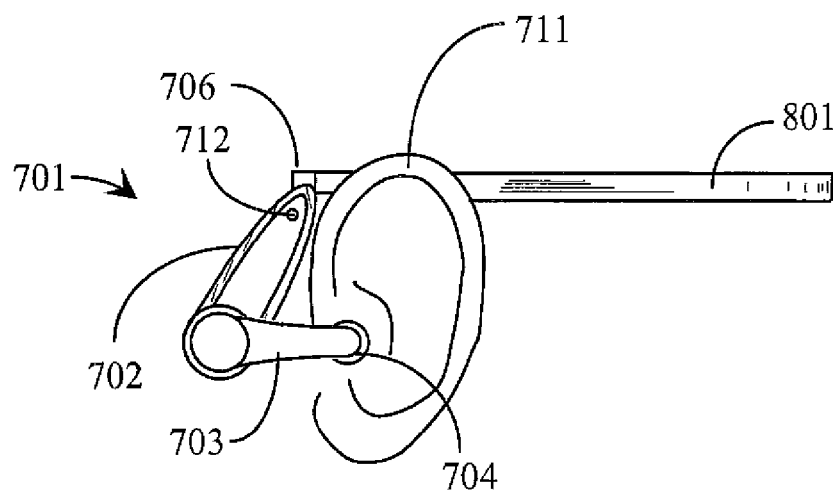

FIG. 8a is a side elevation view of two devices 701 attached to a headset frame 801 in an embodiment of the invention.

Figure 8B:
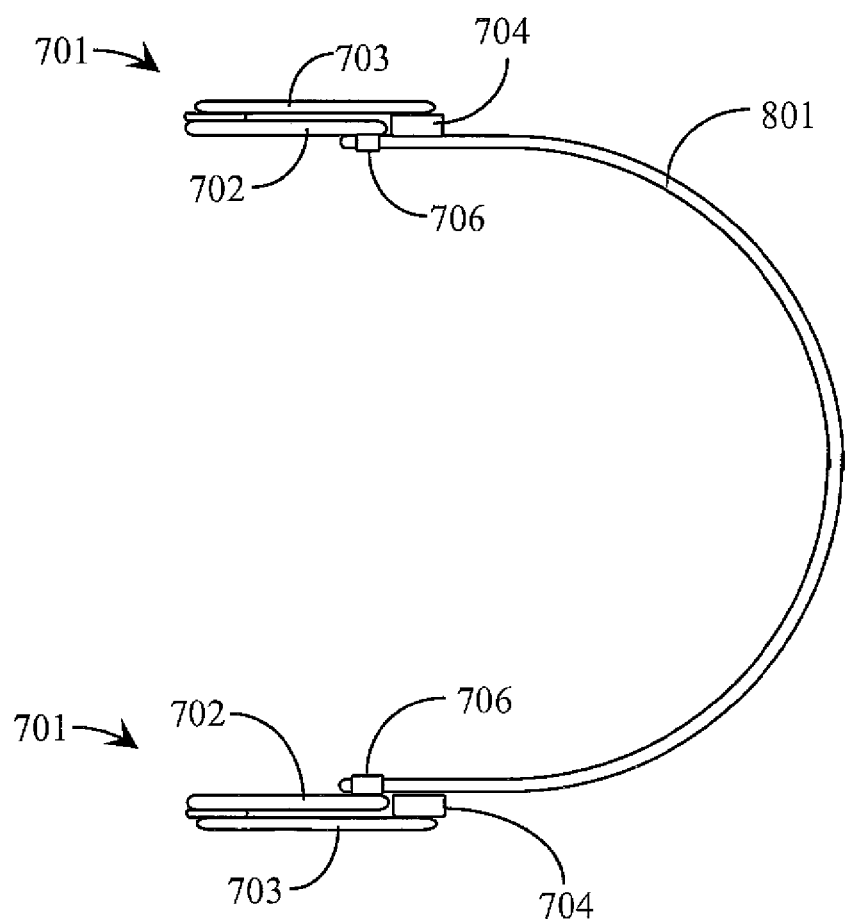

FIG. 8b is a top plan view of the same assembly as FIG. 8a.

Figure 9:
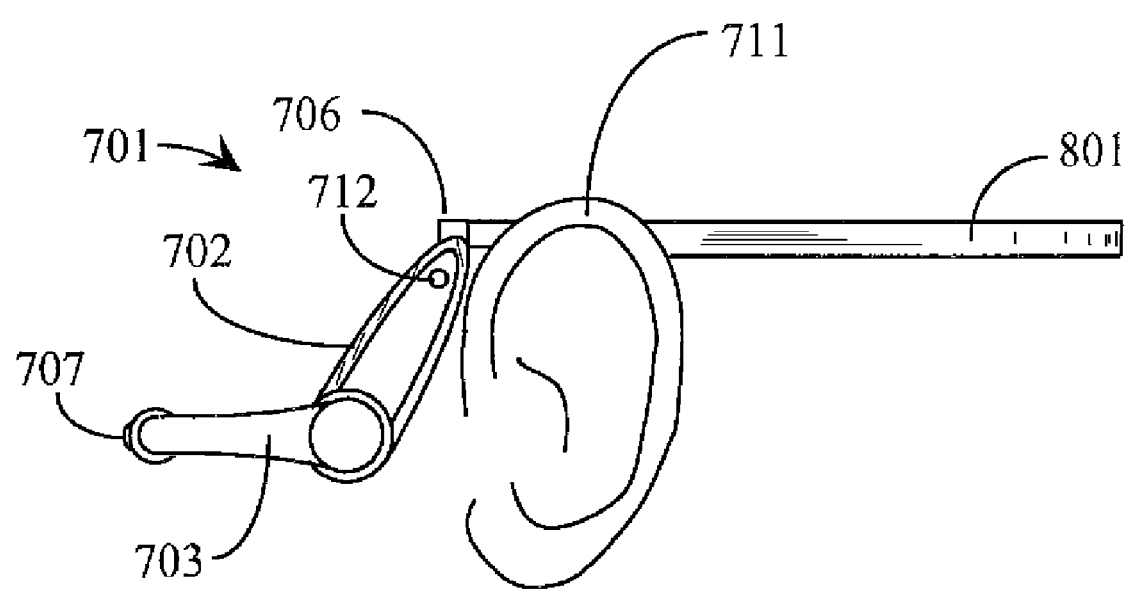

FIG. 9 is an elevation view of a headset frame with a device attached adjusted to have the microphone forward toward a user's mouth.

Figure 10A:
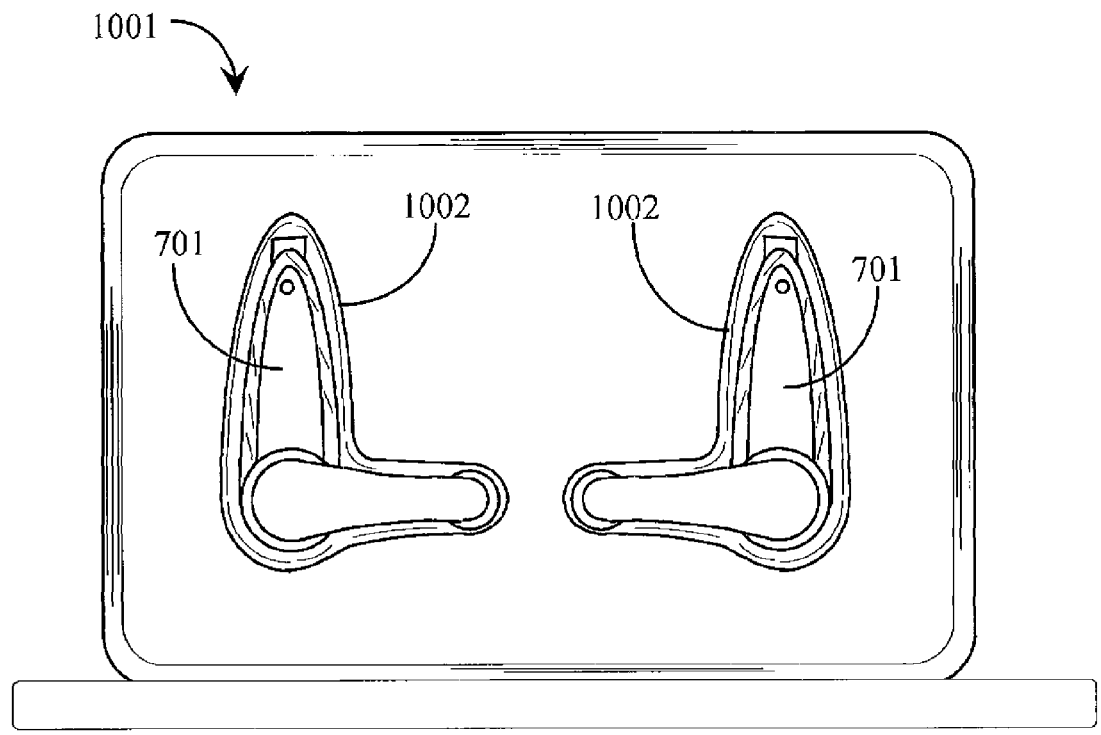

FIG. 10a is a front elevation view of a charging bay for devices.

Figure 10B:
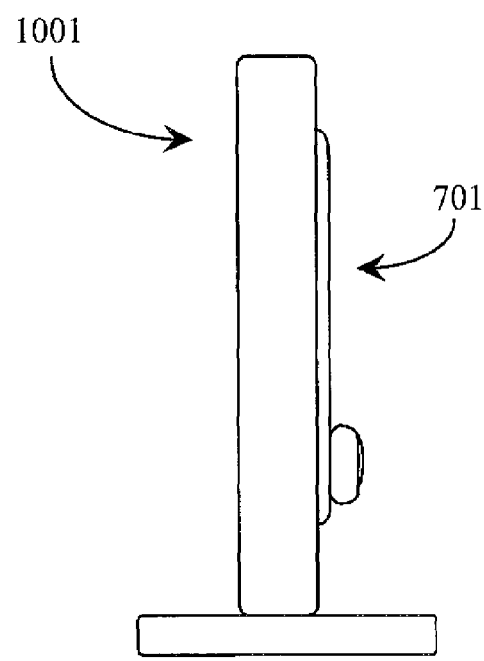

FIG. 10b is a side elevation view of the charging bay of FIG. 10a.

Figure 11:
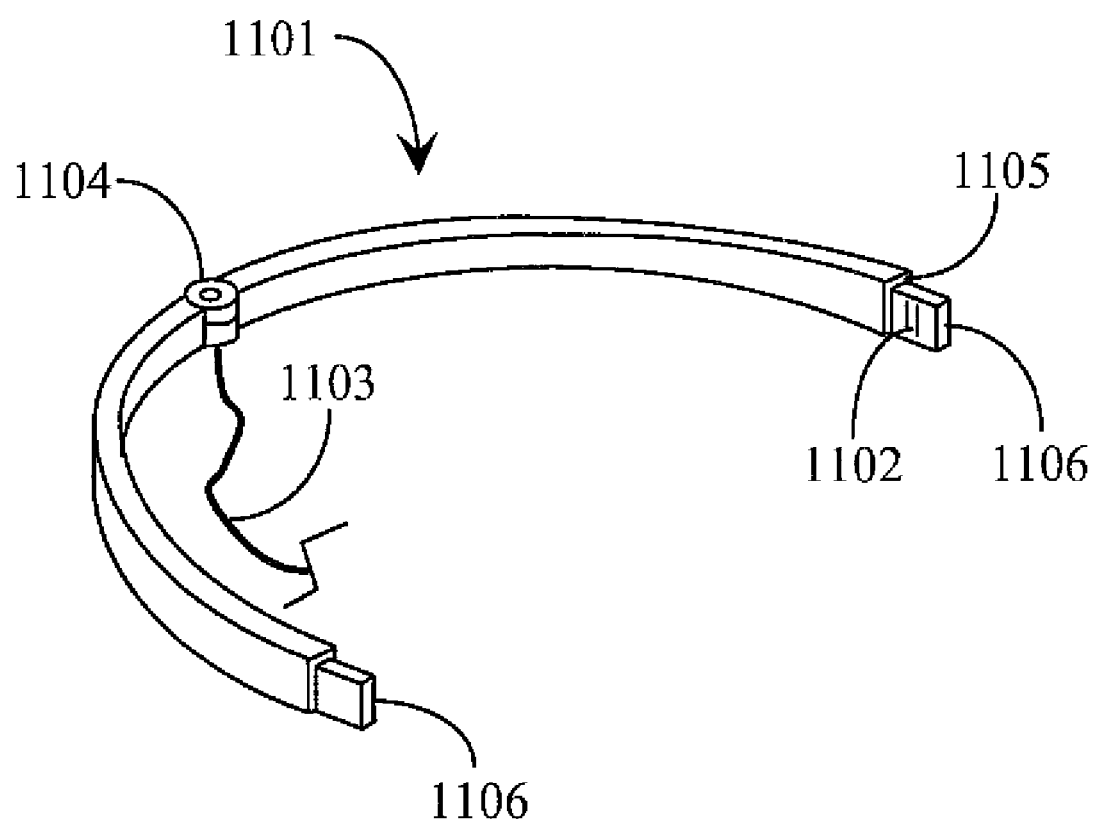

FIG. 11 is a perspective view of a headset frame in another embodiment of the invention.

FIG. 12 is a side elevation view of a device comprising an ear hangar strap for use without a headset frame.

DESCRIPTION OF THE PREFERRED EMBODIMENTS

Figure 1A:
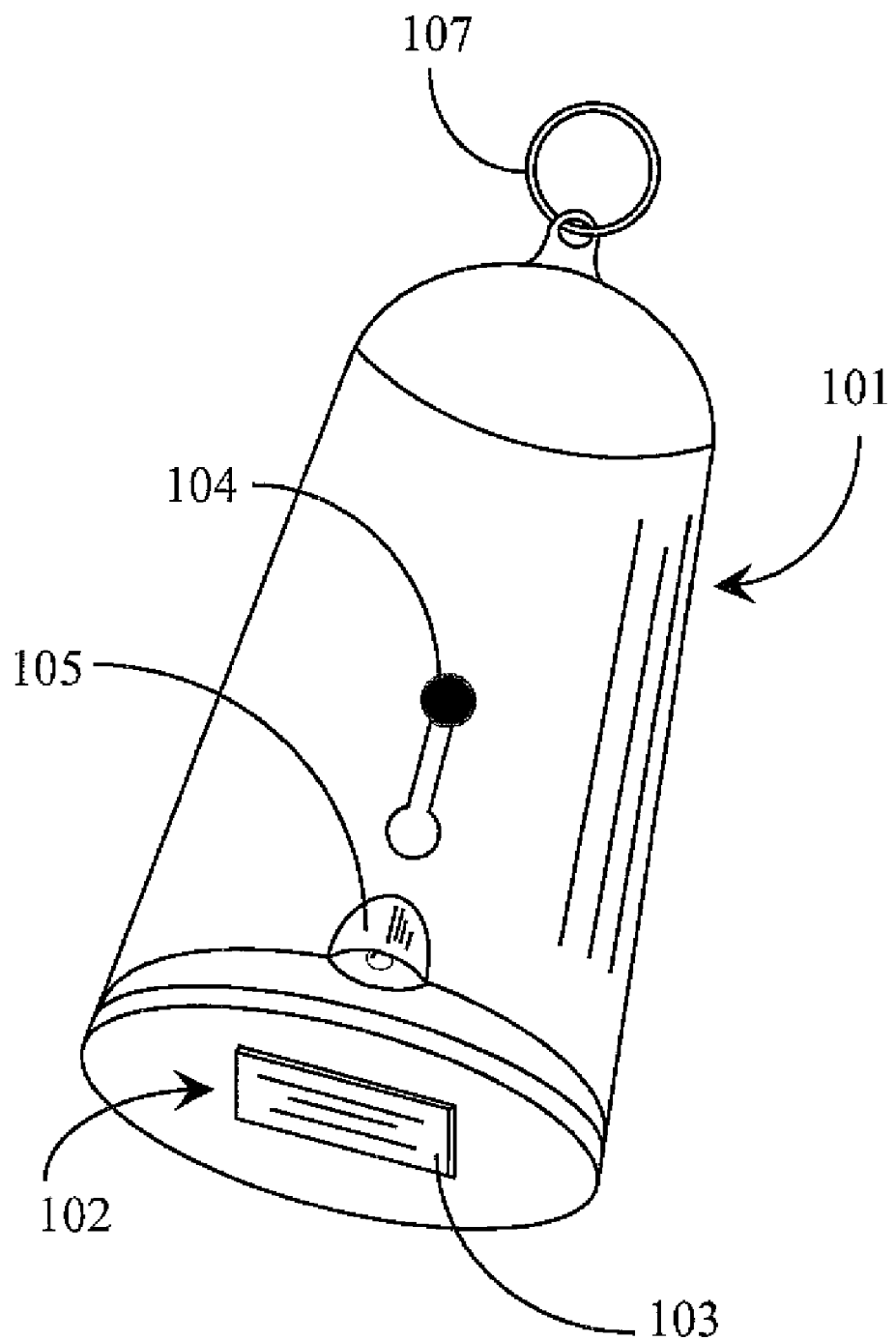
FIG. 1a is a perspective view of a thumb drive according to an embodiment of the present invention, with the connector retracted.

In one embodiment of the invention a thumb drive has a manually extendable and retractable male USB connector. FIG. 1a is a perspective view of such a drive 101 according to an embodiment of the invention.

Drive 101 has in this example a physical opening 102 generally rectangular in shape, matching the rectangular cross section of a male USB connector. Port 102 is closed, when the connector is withdrawn within a body of the thumb drive, by a retractable physical closure, such as a flap gate 103, which may be hinge mounted in one embodiment to allow passage of a male USB connector.

It will be apparent to the skilled artisan that there are a variety of ways a closure may be implemented for opening 102. Such a closure may be made of a number of different materials, such as rubber or plastic materials, and may be implemented in a number of different ways. For example, the gate could be a solid metal or rigid plastic material, and a mechanism for opening and closing may be provided also in a number of different ways.

Further to the above description, a sliding button 104 is implemented through an opening in a wall of a case for the drive. This button in one embodiment has two functions. Firstly the button is implemented in a manner to turn on a flashlight element 105 when the button is depressed. Secondly, the button is detented in a way that when depressed it may be pushed forward, causing an internal mechanism to translate forward, urging a male USB connector to extend through port 102, and to lock in place as extended. The locking in place in one embodiment is a function of the detenting of the button mechanism.

It will also be apparent to the skilled artisan that such a manual operator for translation of a mechanism to extend the male connector through opening 102 may be implemented in several ways as well, such as by a knob or a slide. In one embodiment, for example, the retractable connector is spring-loaded into the case of the thumb drive with a detent for keeping it retracted until a user trips the detent. A similar detent keeps the connector in an extended position until the user pushes the connector back into the case.

Light 105 in one embodiment is offset to one side of the thumb drive as shown, and is provided for aiding in finding a USB port on a candidate computer. The light may also be used as a utility flashlight for a number of other purposes. The skilled artisan will understand that there are a variety of ways control for the light may be provided in addition to the slide button 104, such as by a separate switch implemented through the body of the thumb drive.

Figure 1B:
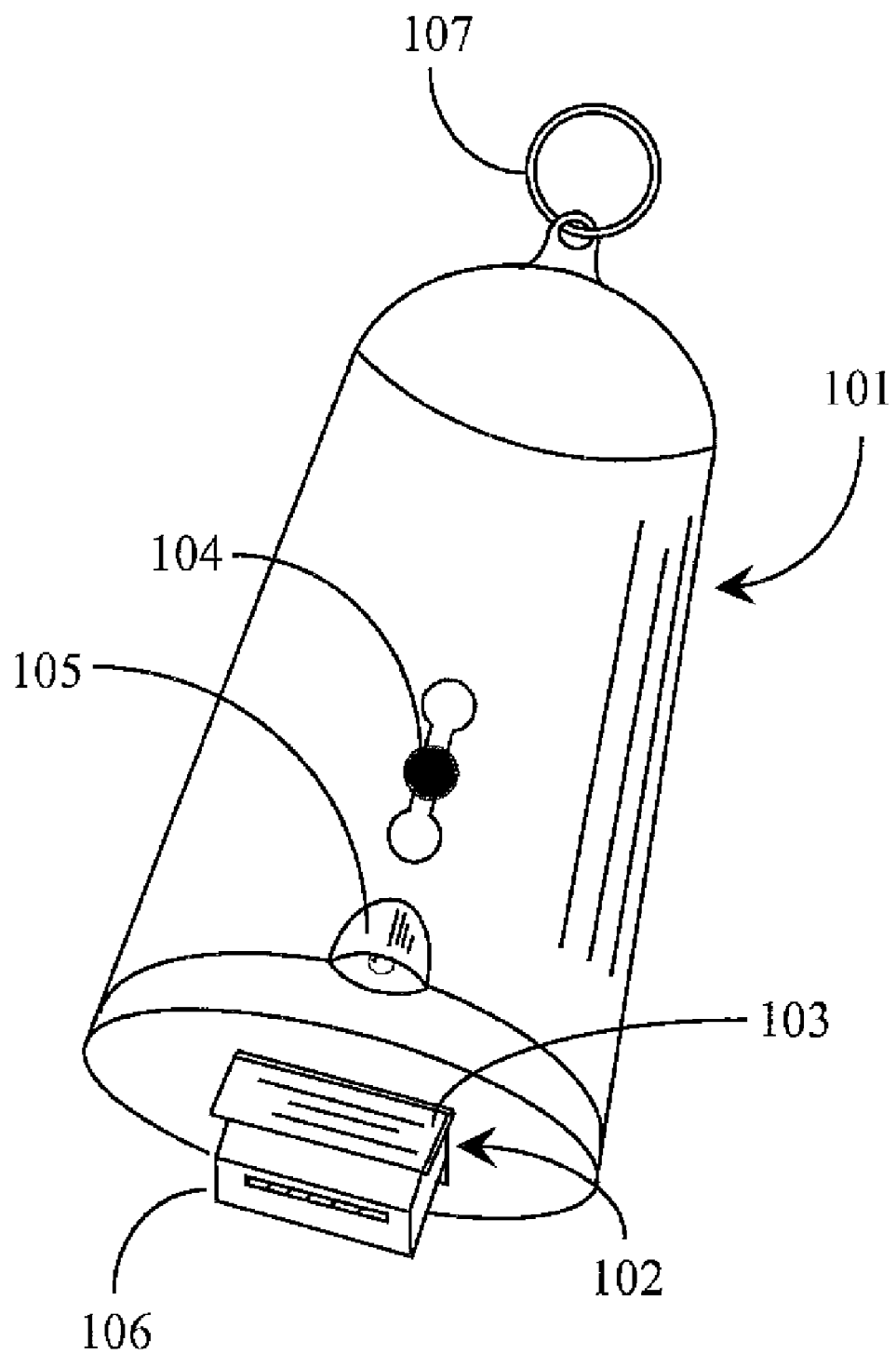
FIG. 1b is a perspective view of the thumb drive of FIG. 1a with the connector partly extended.

FIG. 1b is a perspective view of the thumb drive of FIG. 1 with a USB male connector extended part way through port 102. It may be seen that the relative position of slide button 104 corresponds to the relative extension of the USB port 106.

Figure 1C:
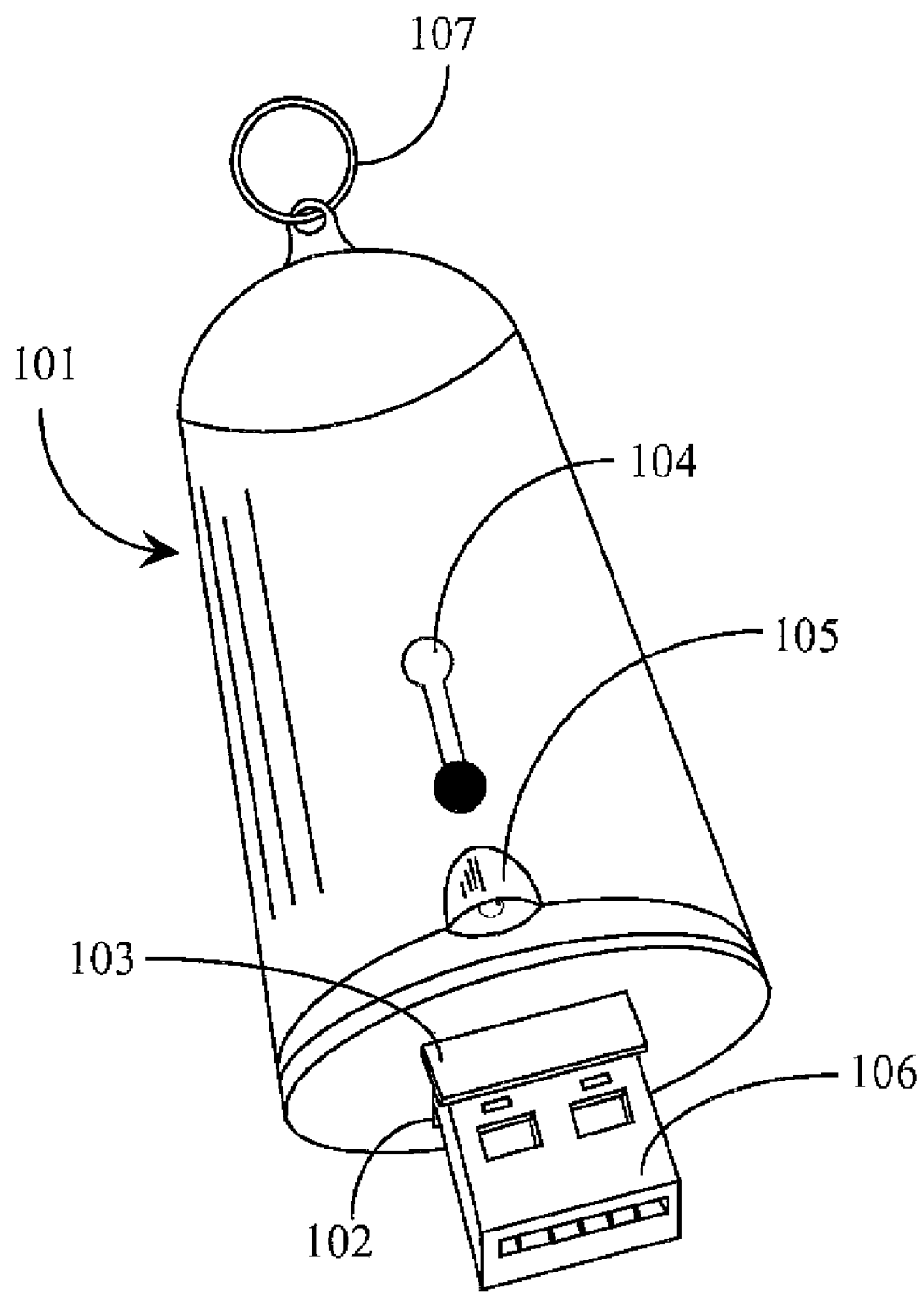
FIG. 1c is a perspective view of the thumb drive of FIG. 1a with the connector fully extended.

FIG. 1c is a perspective view of the thumb drive of FIGS. 1a and 1b with male connector 106 fully extended and locked into place. In some embodiments of the invention a connection ring 107 may be provided to facilitate attachment to a neck cord or key ring.

Figure 2:
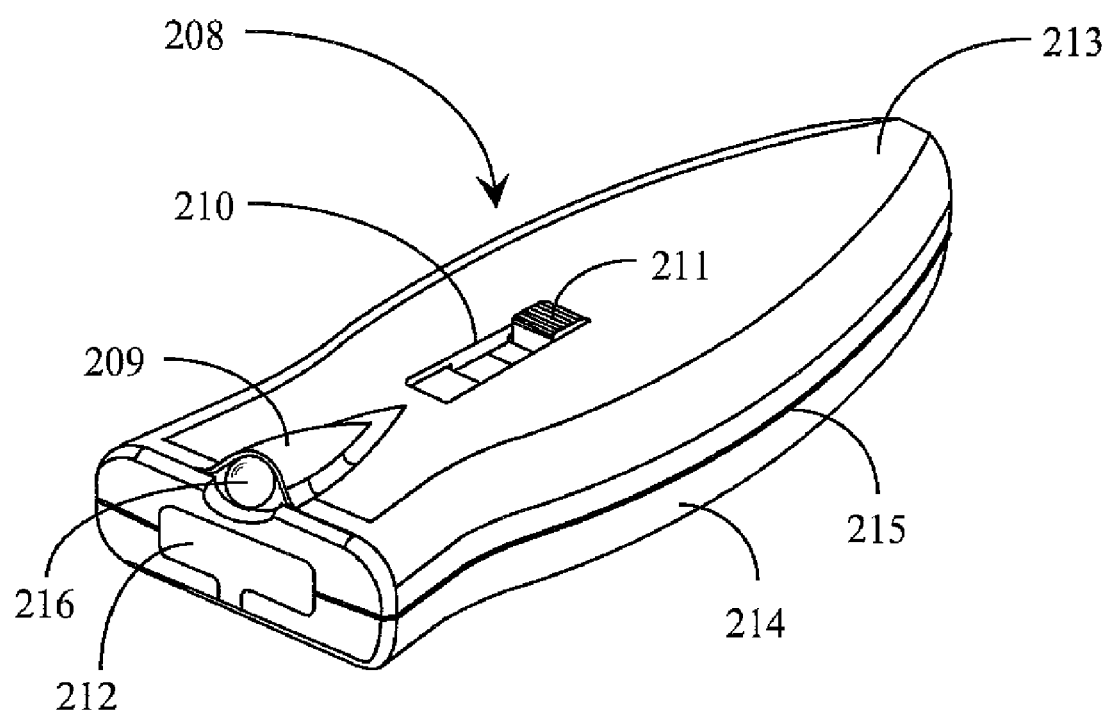
FIG. 2 is a perspective view of a thumb drive according to an alternative embodiment of the present invention.

FIG. 2 is a perspective view of a thumb drive 208 in yet another embodiment of the present invention. In this embodiment a body shape is implemented that provides a more comfortable and secure grip when using the drive. Many of the elements for the embodiment shown by FIG. 2 are the same as for the embodiment shown by FIGS. 1a-1c. There is a molded body that, in this case, is made in two separate parts 213 and 214, joining along a line 215. A raised portion 209 of the upper section 213 provides a housing for a light 216, which may be one or a cluster of high-intensity LEDs or an incandescent bulb, for example. A spring-loaded button 211 is implemented through an opening 210 in section 213 for on-off input for the light 216 and slide operation for a male USB connector that may be caused to extend through door 212 by urging button 211 forward. Detents implemented in opening 210 provide for restraining the USB connector in extended or retracted position, as further described below.

FIG. 3a is a partially exploded perspective view of thumb drive 208 of FIG. 2, showing some further detail of inner components. Section 213 is shown disconnected from section 214 and raised to show additional inner detail. Within the thumb drive a module 301 comprises flash memory, in quantity of perhaps 256 Mbytes, or more. Module 301 also comprises button 211 implemented in a structure 302 that allows the button to be depressed and to make electrical contact to energize light 216 through a connection path 303 from an on-board battery source 304. The battery can be any one of many sorts, such as a rechargeable battery.

The internal flash memory of module 301 is coupled to I/O contacts of a USB male connector 305 which is built into module 301. Internal connections, microprocessor, and firmware applying the microprocessor to functions of the apparatus are not shown, but will be apparent to those with skill in the art, as these mostly exist in the commercial arena at the time of filing the present application.

Module 301 in this an some other embodiments is implemented within the shell of portions 213 and 214 restrained between molded-in tracks, such that the module may be translated from a position wherein USB male connector 305 is fully withdrawn, to a position wherein the USB connector is fully extended, and back again. Detents molded into upper portion 213 in conjunction with opening 210 provide for retention at the fully withdrawn and near the fully extended positions, in concert with depressing button 211. To extend or withdraw one may depress button 211 and release it at the end of the movement. When USB connector 305 extends, door 212 is urged aside in a manner that when the USB connector is again withdrawn, the door closes again.

FIG. 3b shows one edge 306 of opening 210 of portion 213 in elevation. This edge of the opening is formed into lands at two elevations, these being lands 308 and 310 at a lower level and lands 309 and 311 at a higher level.

Figure 3C:
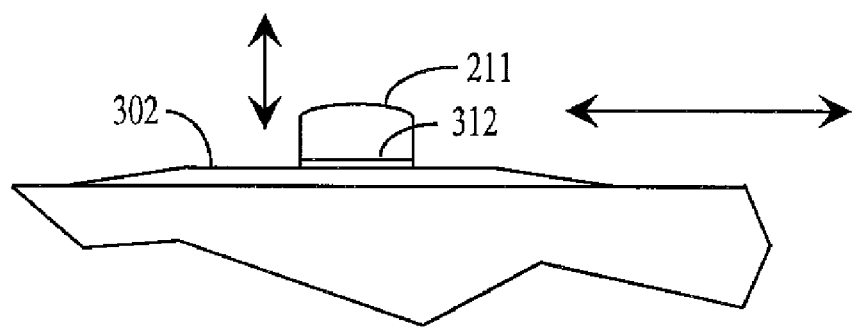

FIG. 3c shows button 211 and structure 302 implemented on module 301. As previously described, structure 302 allows button 211 to be depressed to make electrical contact to illuminate light 216. Button 211 further has a land 312, also seen in FIG. 3a in perspective that engages one of lands 308-311 in assembly, depending on the relative extension of connector 305.

Figure 3D:
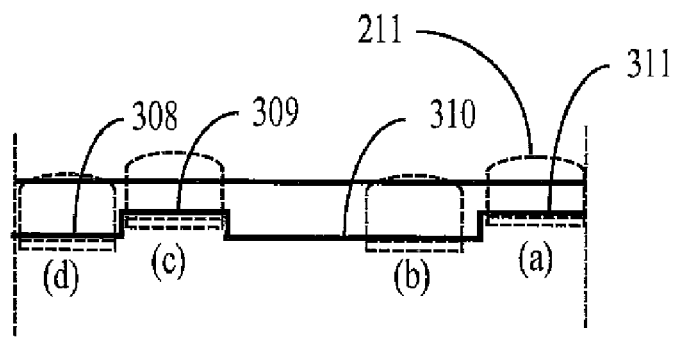

FIG. 3d shows edge 306 with lands 308-311 with button 211 superimposed at four different positions (a) through (d) representing four different extensions of connector 305. With button 211 in position (a) the male USB connector is fully retracted within the body of the thumb drive. Because button 211 is spring-loaded upward, this provides a detent that holds the connector retracted until a specific action by the user.

To move the connector forward, that is, to extend the connector, a user depresses button 211 such that land 312 of the button is below land 310 of edge 306. This depressing of button 211 makes electrical contact turning on light 216. Now module 301 may be moved forward by urging button 211 forward to extend USB connector 305. Land 310 ensures that the light stays on if the button is released.

Land 308 allows the user to move connector 305 to a maximum forward position, passing land 309, at which point the light will stay lit. This allows for the user to release the button while looking for a female USB port for connection, and keeps the light on.

When the female USB port is found and male connector 305 is inserted, the action of insertion will retract the male connector in the thumb drive until the spring-loaded button clicks up to land 309, providing a detent near the fully extended poison with the light off and the thumb drive connected to the appliance having the female USB port.

The skilled artisan will be aware that the detent mechanisms described above with reference to FIGS. 3b-3d are exemplary of one such mechanism that might be used, and that are there are a variety of other ways the detents may be provided.

One simple rendition of a door 112 or 212 is shown in FIGS. 4a and 4b. In this example a rubber-like panel 112 is affixed behind an opening between upper and lower portions 113 and 114. As connector 305 is extended from the poison shown in FIG. 4a the rubber-like panel is simply urged aside, until with full extension, panel 112 is positioned as shown in FIG. 4b. When connector 305 is again withdrawn panel 112 springs back to an upright position as shown in FIG. 4a, closing the opening to dust and debris, for example.

It will be apparent to those with skill in the art that the door for the opening through which the male USB connector protrudes, such as panel 112 in FIGS. 4a and 4b, is not in and of itself the patentable feature of the invention, but a convenience to protect the internal details of the novel thumb drive when the connector is withdrawn. Simple examples of such a door have been provided, but there are a further variety of ways such a protective door might be implemented. There might be, for example, a rigid door hinged in some manner, and the door may or may not be closed by a spring detent. There are many other possibilities as well.

In embodiments of the invention described above there is no need for a protective plastic cap for the male USB connector as is common in the art at the time of filing the present application, and the light integrated into the thumb drive in some embodiments provides real aid to a user in finding and connecting to unused USB ports. The light has other uses as a simple utility flashlight as well.

In another embodiment of the present invention, illustrated in FIG. 5, further enhancement is provided such that a thumb drive 501 may also operate as a music repository and player, such as an MP3 player. In this embodiment the memory capacity of the thumb drive is controlled in the same manner that is done in the art for MP3 players and the like, so that music and other audio material may be downloaded to the unique thumb drive from a computer device, and may be played back to a user. For this purpose a display 502 is provided, which may be an LED (light-emitting diode) or an LCD (liquid crystal display) is provided, and additional firmware for internal microprocessor control is provided to manage storage of audio files, such as MP3 files, for songs, and to display and render the songs at a user's command.

Appropriate controls, such as buttons 503 for scrolling through a playlist, are provided, and audio rendition is through line 504 to a set of ear-buds 505. Earphones may be used as well, or any set of battery-powered or conversion unit powered speakers, such as those sorts of speakers used with PCs from a soundcard. In some embodiments a microphone 506 is also provided, and controls are provided for a user to record such as memorandums and notes, using the thumb drive as a personal digital recorder. A small, built-in speaker 507 may also be implemented in some embodiments.

FIG. 6 is a perspective view of a thumb drive 601 associated with a Bluetooth™ headset in still another embodiment of the invention. Bluetooth™ is a well-known system and protocol for wireless transmission of audio and other date over relatively short distances, and information relative to same is easily accessible to the skilled artisan. In this embodiment thumb drive 601 comprises a Bluetooth™ transmitter, which transmits to left and right earpieces 603 adapted to a pair of glasses 602, such as sunglasses. The controls for thumb drive 601 are essentially the same as described above for drive 501. In alternative embodiments the Bluetooth™ earpieces may be worn separately from the glasses, or may be associated with a hat or a cap for example.

In another aspect of the invention a system of headsets and speaker elements is provided with enhanced utility and functionality over what is available in the art at the time of filing.

FIG. 7a is a side elevation view of a single speaker/microphone device 701 in an embodiment of the present invention. FIG. 7b is a side elevation view of the same device, and FIG. 7c is a back elevation view of the same device. Device 701 is provided to be combined in a variety of ways with carriers of various sorts that a user might employ, and also to provide a range of useful functions not presently available.

Device 701 comprises in this embodiment a base element 702 having an attachment interface 706 for connecting to a carrier device, such as a headset frame or earpieces of a pair of glasses. A rotatably adjustable element 703 is pivotable about base element 702 at a pivot point 705, and comprises an earbud 704 at the free end, as well as a microphone 707 on a side of the earbud. In addition in this embodiment there is a charging interface 708 for a male connector on one side of the base element 702, and in some embodiments another charging interface 709 comprising two conductive strips on a backside of base element 702.

Device 701 comprises a transceiver 710 compatible with Bluetooth™ Protocol for receiving audio signals from remote devices, such as cellular telephones, MP3 players and a variety of other handheld devices, and for transmitting signals from input by a user via microphone 707 to remote devices. Device 701 also comprises a rechargeable power supply connected to one or both of interfaces 708 and 709, and suitable circuitry connecting electrical and electronic elements, which will be clear to the skilled artisan given the disclosure herein.

FIG. 8a is a side elevation view of two devices 701 attached to a headset frame 801 in an embodiment of the invention. FIG. 8b is a top plan view of the same assembly as FIG. 8a. In this particular example the devices 701 are attached to simple plastic headband 801, which a user places around the back of the head and over and behind the ears. Devices 701 are attached in this example to the band each by a simple rubber ring 706. Interface 706 in different embodiments may take any one of several forms, including a rubber ring, a snap over plastic fastener, a metal hook device, and other devices. In some embodiment body 702 may rotate around a pivot that is a part of the attachment interface, which will allow body 702 to be adjusted to be more vertical than shown in FIG. 8*a*, or to be angled in the opposite direction. Similarly element 703 may be rotated, as described above, around the point of attachment to body 702, so the ear bud at the end of element 703 may be comfortably placed in the user's ear on each side. A rough approximation of a user's ear is shown as element 711 in FIG. 8*a*.

It will be apparent that the two devices 701 in FIG. 8*b* are not the same, but images of one another. However, in a preferred embodiment one design may be adapted to both sides by adjusting body 702 and element 703 rotationally In preferred embodiments devices 701 also have alternate functionality depending on positioning of element 703 relative to body 702. FIG. 9 illustrates an instance wherein a user has pivoted element 703 to extend away from the ear toward the front of the user's face, that is, toward the mouth. This would be a user's response in the case of an incoming telephone call, which in one embodiment will initiate a ring tone in one or both earbuds. Contacts within the juncture of body 702 and element 703 in this situation as the user rotates element 703 will turn off the speaker in the device thus manipulated, and will enable instead the microphone 707, as well as sending a signal to answer the call in coupled telephone. This will work regardless of which side the user elects to rotate, and the other ear bud will continue to work for the telephone incoming audio.

In another embodiment a pushbutton 712 is functional for placing or answering a telephone call through a coupled telephone. In this situation, pushing button 712 accesses voice dialing when placing a call. In the event of telephone use, audio from an MP3 device is silenced until button 712 is again pressed, or element 703 is rotated back to the user's ear.

In some embodiments the outside surface of body 702 or a light-emitting device implemented on that surface is functional to change color in response to charge level of the on-board power supply. For example, the color may change from green to red at some predetermined threshold of battery discharge. Recharging may be done by connecting a charging cord having two outputs, one for each device, to female connector 108. The source may be a USB connector at the other end of the charging cord, or a power supply transformer plugged into a wall socket.

In another embodiment a charging docking bay 1001 as shown in FIG. 10 may be employed to recharge devices 701. Bay 1001 has two receptacles 1002 shaped to accept devices 701, and the indention of the receptacles is fashioned so that the devices may snap in place and be held until intentionally removed. There are in ach receptacle two contact strips (not shown) located to contact strips 709 on device 701 (see FIG. 7*c*). The docking bay connects either to a transformer plugged into a wall socket or a USB cable to a computer (not shown) for primary power.

In yet another embodiment a headset frame 1101 as shown in FIG. 11 is provided with internal wiring such that devices like devices 701 may be charged while attached to the headset frame. In this embodiment the headset frame has interface areas 1106 each having a set of contacts 1102 facing inward, such that devices 701 may be attached with contact between contacts 1102 and contacts 709 (see FIG. 7*c*). Primary power is provided by a cable 1103 connecting to a socket under the frame and engaged either with a USB port or a transformer plugged into a wall outlet. Optionally there is also a pivot adjustment 1104 allowing a user to adjust the frame for different head sizes.

Figure 12A:
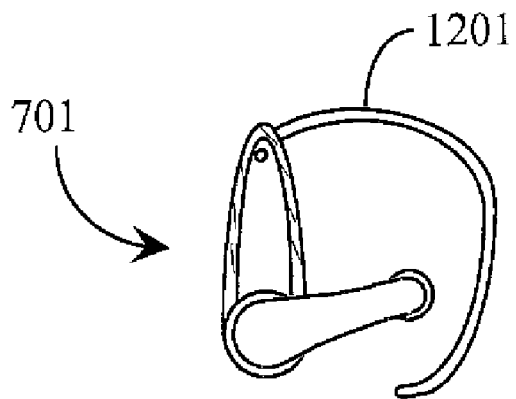
Figure 12B:
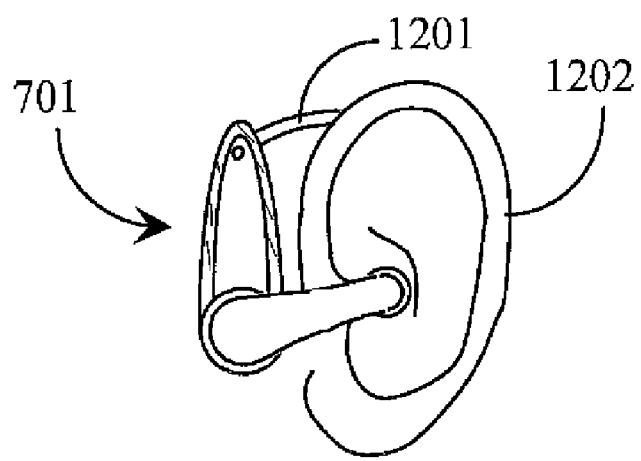

FIG. 12*a* illustrates a device 701 according to an embodiment of the invention adapted to an ear hangar 1201 to be used without a headset frame. Device 1201 is adapted to attach to the device 701 at the same interface used for attachments 706 (see FIGS. 7*a, b, c*). FIG. 12*b* shows the same device engaged behind a user's ear. In this embodiment the user may rotate element 703 forward, just as described before, to enable the microphone, and the devices are still adapted to receive stereo channels broadcast from an MP3 player, and to answer and place telephone calls as described above.

It will be apparent to the skilled artisan that there are a broad variety of changes that may be made in the embodiments of the invention described above without departing from the spirit and scope of the invention. For example, there are a broad variety of materials that may be used for various elements of the thumb drive in embodiments of the invention. The controls in those embodiments that provide audio playback can be done in several ways. There are various ways the extendable male connector may be implemented, and the like. There are a wide variety as well of ways the control functions may be implemented. Therefore the invention should only be limited by the claims which follow.

What is claimed is:

1. A wireless headphone device configured as a left-side or as a right-side device, comprising: a first elongate portion having first and second opposite ends with an attachment interface at the first end, the first portion comprising an on-board power supply and a transceiver with functional circuitry; and a second elongate portion coupled pivotally to the first portion at the second end, and having an ear bud and a microphone at an end away from the pivotal coupling; wherein the functional circuitry enables receiving and playing of audio from an MP3 player through the ear bud, and use as speaker and microphone for a wirelessly coupled telephone, and wherein, configured as a left-side device the microphone is enabled with the second elongate portion positioned rotationally to one side of the first elongate portion, disabled otherwise, and configured as a right-side device the microphone is enabled with the second elongate portion positioned rotationally to the opposite side of the first elongate portion, disabled otherwise.

2. The device of claim 1 wherein the attachment interface comprises a flexible rubber, synthetic rubber or plastic loop for engaging an arm of a headset frame.

3. The device of claim 1 wherein the attachment interface comprises a strap for folding over an arm of a headset frame, and fastening back to the first elongate portion.

4. The device of claim 1 wherein the attachment interface comprises a hinged mechanism with a fold-over element for engaging an arm of a headset frame.

5. The device of claim 1 wherein rotating the second elongate portion to a position to extend away from a user's ear causes the circuitry in the first elongate portion to send a signal to answer an incoming telephone call on a telephone device coupled by a Bluetooth™-compatible wireless protocol.

6. The device of claim 1 further comprising a pushbutton on a surface of the first elongate portion enabled for sending a signal when pressed to answer an incoming telephone call on a telephone device coupled by a Bluetooth™-compatible wireless protocol.

7. The device of claim 1 wherein the first elongate portion comprises on one surface an interface for charging the on-board power supply.

8. The device of claim 7 wherein the interface for charging is a female connector for engaging a male connector of a charging cable from either a USB port or from a transformer engaged in a wall outlet.

9. The device of claim 7 wherein the interface for charging is a pair of electrodes implemented on a surface of the first elongate portion for engaging similar electrodes connector for engaging a male connector of a charging cable from either a USB port or from a transformer engaged in a wall outlet.

10. The device of claim 1 wherein the attachment interface comprises an ear hangar loop for engaging over a user's ear to position the device to place the ear bud in the user's ear.

11. The device of claim 1 further comprising a light-emitting device implemented on a surface of the device configured to change color according to charge level of the on-board power supply.

* * * * *